(12) United States Patent
Wang et al.

(10) Patent No.: US 10,841,012 B2
(45) Date of Patent: Nov. 17, 2020

(54) OPTICAL REFLECTIVE MULTIPLEXER CHIP, LASER TRANSMITTER CHIP, AND OPTICAL TRANSMITTER

(71) Applicant: HUAWEI TECHNOLOGIES CO., LTD., Guangdong (CN)

(72) Inventors: Tao Wang, Wuhan (CN); Ning Liu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/051,889

(22) Filed: Aug. 1, 2018

(65) Prior Publication Data
US 2018/0375583 A1 Dec. 27, 2018

Related U.S. Application Data

(63) Continuation of application No. PCT/CN2016/073152, filed on Feb. 2, 2016.

(51) Int. Cl.
*G02B 6/00* (2006.01)
*G02B 6/42* (2006.01)
(Continued)

(52) U.S. Cl.
CPC ........... *H04B 10/503* (2013.01); *H04B 10/00* (2013.01); *H04B 10/50* (2013.01); *H04B 10/506* (2013.01);
(Continued)

(58) Field of Classification Search
CPC .... H04B 10/503; H04B 10/506; H04B 10/50; H04B 10/00; H04J 14/06; H04J 14/021; H04J 14/02
(Continued)

(56) References Cited

U.S. PATENT DOCUMENTS 7,068,886 B2 * 6/2006 Oh .................... G02F 2/002
359/337.21
8,606,107 B2 12/2013 Bai et al.
(Continued)

FOREIGN PATENT DOCUMENTS

CN 102082610 A 6/2011
CN 102158772 A 8/2011
(Continued)

OTHER PUBLICATIONS

International Search Report and Written Opinion issued in International Application No. PCT/CN2016/073152 dated Oct. 31, 2016, 21 pages.
(Continued)

*Primary Examiner* — Kaveh C Kianni
*Assistant Examiner* — Hung Q Lam
(74) *Attorney, Agent, or Firm* — Fish & Richardson P.C.

(57) ABSTRACT

An optical reflective multiplexer chip, a laser transmitter chip, and an optical transmitter are disclosed. The optical transmitter includes the laser transmitter chip, an optical fiber, and the optical reflective multiplexer chip. The laser transmitter chip includes a bi-directional light emitting laser, a polarization splitter-rotator, and a first external port. The optical reflective multiplexer chip includes a combiner, a second external port, N third external ports, N microring resonant cavities, N polarization splitter-rotators, N first branch waveguides, and N second branch waveguides. The combiner is connected to the first branch waveguide, the second branch waveguide, and the second external port. The first external port is connected to the third external port by using the optical fiber.

6 Claims, 3 Drawing Sheets

(51) Int. Cl.
  *H04B 10/50* (2013.01)
  *H04B 10/00* (2013.01)
  *H04J 14/02* (2006.01)
  *H04J 14/06* (2006.01)
(52) U.S. Cl.
  CPC ............ *H04J 14/02* (2013.01); *H04J 14/021* (2013.01); *H04J 14/06* (2013.01)
(58) Field of Classification Search
  USPC .................. 385/9–11, 30–32, 41, 42, 49, 50
  See application file for complete search history.

(56) References Cited

U.S. PATENT DOCUMENTS

| | | | |
|---|---|---|---|
| 9,640,943 B2 | 5/2017 | Chuang et al. | |
| 9,766,403 B2* | 9/2017 | Jiang | G02B 6/29395 |
| 2006/0083464 A1 | 4/2006 | Oh et al. | |
| 2010/0303469 A1 | 12/2010 | Barton et al. | |
| 2011/0038635 A1 | 2/2011 | Bai | |
| 2011/0129227 A1 | 6/2011 | Wen et al. | |
| 2012/0141128 A1* | 6/2012 | Bai | H04B 10/506 398/65 |
| 2012/0269516 A1 | 10/2012 | Liu et al. | |

FOREIGN PATENT DOCUMENTS

| | | |
|---|---|---|
| CN | 102405570 A | 4/2012 |
| CN | 102405607 A | 4/2012 |
| CN | 103259190 A | 8/2013 |
| CN | 102388547 B | 3/2015 |
| CN | 204536588 U | 8/2015 |
| CN | 105207057 A | 12/2015 |
| EP | 2637266 A1 | 9/2013 |
| EP | 2698933 A2 | 2/2014 |
| WO | 2011066775 A1 | 6/2011 |

OTHER PUBLICATIONS

Marco Presi et al. Stable self-seeding of R-SOAs for WDM-PONs, 2011 Optical Fiber Communication Conference and Exposition and the National Fiber Optic Engineers Conference. Mar. 2011. 4 pages. XP031946272.

Extended European Search Report issued in European Application No. 16888646.3 dated Jan. 16, 2019, 9 pages.

EPO Communication pursuant to Article 94(3) EPC issued in European Application No. 16888646.3 dated Feb. 19, 2020, 7 pages.

* cited by examiner

OPTICAL REFLECTIVE MULTIPLEXER CHIP, LASER TRANSMITTER CHIP, AND OPTICAL TRANSMITTER

CROSS-REFERENCE TO RELATED APPLICATIONS

This application is a continuation of International Application No. PCT/CN2016/073152, filed on Feb. 2, 2016, the disclosure of which is hereby incorporated by reference in its entirety.

TECHNICAL FIELD

The present invention relates to the field of optical communications technologies, and in particular, to an optical reflective multiplexer chip, a laser transmitter chip, and an optical transmitter.

BACKGROUND

With flexible deployment of a dense wavelength division multiplexing (English full name: Dense Wavelength Division Multiplexing, WDM for short) device and a centralization trend of a baseband processing unit (BBU for short), data transmission between a WDM technology-based optical transport network (OTN) as a common public radio interface (CPRI for short) and a radio remote unit (RRU for short) or a multiple-input multiple-output (MIMO for short) array antenna has become an important interconnection solution. As a quantity of radio services increases gradually, a quantity of RRUs and a quantity of optical modules required in each RRU increase greatly. If implementation of a radio fronthaul relies on a conventional WDM system, optical modules in RRUs need lasers of different wavelengths. This configuration manner may cause a series of problems. For example, because optical modules allocated to the RRUs are different, common public radio interfaces CPRIs need to be in one-to-one correspondence to port numbers of the RRUs, and an operator needs to stock up on optical modules of different wavelengths. To resolve the foregoing problems, a concept of a colorless WDM light source is proposed in the industry. That is, an RRU transceiver module is independent of a wavelength. A transmitter wavelength of a laser of an RUU transceiver module may be automatically adaptive to a wavelength of a connected port such as an arrayed waveguide grating (AWG for short), so that a plug-and-play function is implemented on any port such as an AWG A self-injection locking technology is a solution that is proposed recently to implement a colorless WDM optical transmitter. For example, multi-longitudinal mode (wavelength) light emitted by a Fabry Perot-Laser Diode (FP-LD for short) is reflected and is re-injected into the FP-LD, to lock a particular wavelength. However, currently a colorless optical transmitter based on a self-injection locking technology is formed by high-cost discrete components (for example, a Faraday rotator and an AWG component), and in an actual application, the optical transmitter has excessively high costs.

SUMMARY

The present invention provides an optical reflective multiplexer chip, a laser transmitter chip, and an optical transmitter, to resolve a problem that currently a colorless WDM optical transmitter based on a self-injection locking technology has high costs.

In view of this, a first aspect of embodiments of the present invention provides an optical reflective multiplexer chip. The optical reflective multiplexer chip includes: a combiner, a second external port, N third external ports, N microring resonant cavities, N polarization splitter-rotators, N first branch waveguides, and N second branch waveguides, where N is a positive integer and is greater than or equal to 1, the N polarization splitter-rotators are in one-to-one correspondence to the N first branch waveguides, the N polarization splitter-rotators are in one-to-one correspondence to the N second branch waveguides, the N polarization splitter-rotators are in one-to-one correspondence to the N third external ports, and the N polarization splitter-rotators are in one-to-one correspondence to the N microring resonant cavities; the combiner is separately connected to the N first branch waveguides, the N second branch waveguides, and the second external port; each of the N polarization splitter-rotators is connected to a corresponding first branch waveguide, a corresponding second branch waveguide, and a corresponding third external port; and each of the N polarization splitter-rotators is configured to: receive polarized light, and transmit the polarized light to the corresponding first and second branch waveguides after the polarized light passes through the polarization splitter-rotator; each of the N microring resonant cavities is configured to: perform wavelength selection on the light transmitted to the corresponding first branch waveguide and the corresponding second branch waveguide, output, from the second external port by using the combiner, a part of single-mode light obtained after the selection, and transmit the other part of the light back to the polarization splitter-rotator as reflective polarized light; and the polarization splitter-rotator is configured to: perform polarized coupling on the reflective polarized light transmitted back by the corresponding microring resonant cavity, and output the coupled light from the corresponding third external port.

With reference to the foregoing embodiment, in a possible design, each of the N polarization splitter-rotators includes a fifth waveguide and a sixth waveguide, the fifth waveguide corresponding to each polarization splitter-rotator is connected to the corresponding first branch waveguide, and the sixth waveguide corresponding to each polarization splitter-rotator is connected to the corresponding second branch waveguide;

each of the N polarization splitter-rotators is specifically configured to receive the polarized light from the corresponding third external port by using the corresponding fifth waveguide; after passing through the corresponding polarization splitter-rotator, the polarized light is split into fourth polarized light having a first polarization direction and fifth polarized light having a second polarization direction, where the first polarization direction is perpendicular to the second polarization direction; the fifth polarized light is transmitted to the corresponding second branch waveguide by using the sixth waveguide, and is converted into sixth polarized light having the first polarization direction; subsequently, each of the N microring resonant cavities is configured to: perform wavelength selection on the sixth polarized light, output, from the second external port by using the combiner, a part of light obtained after the selection, and transmit, to the corresponding polarization splitter-rotator by using the corresponding first branch waveguide and the corresponding fifth waveguide, the other part of the light as first reflective polarized light; and similarly, each of the N microring resonant cavities is further configured to: perform wavelength selection on the fourth polarized light in the first branch waveguide, output, from the second external port by using the combiner, a part of light obtained after the selection, transmit the other part of the light to the corresponding polarization splitter-rotator by using the corresponding second branch waveguide and the corresponding sixth waveguide, couple the other part of the light to the corresponding fifth waveguide, and convert the other part of the light into second reflective polarized light having the second polarized direction; and finally, the first reflective polarized light and the second reflective polarized light are output from the corresponding third external port by using the corresponding fifth waveguide.

With reference to the foregoing embodiment, in a possible design, the fourth polarized light and the sixth polarized light are transverse electric (TE for short) mode polarized light, the fifth polarized light is transverse magnetic (TM for short) mode polarized light, and the second reflective polarized light is TM mode polarized light.

A second aspect of the embodiments of the present invention provides a laser transmitter chip. The laser transmitter chip includes a bi-directional light emitting laser, a polarization splitter-rotator, and a first external port, where the bi-directional light emitting laser is connected to the polarization splitter-rotator, and the polarization splitter-rotator is connected to the first external port.

Specifically, the bi-directional light emitting laser is configured to emit polarized light; and the polarization splitter-rotator is configured to: perform polarized coupling on the polarized light emitted by the bi-directional light emitting laser, and output the coupled light from the first external port, and in another case, receive reflective polarized light corresponding to the polarized light from the first external port, perform polarized splitting on the reflective polarized light, and separately inject the split light into the bi-directional light emitting laser. It should be noted that a polarization direction of the polarized light emitted by the bi-directional light emitting laser is the same as a polarization direction of the light injected into the bi-directional light emitting laser.

With reference to the foregoing embodiment, in a possible design, the bi-directional light emitting laser may specifically include a first waveguide, a second waveguide, a first port, and a second port, where specific connection relationships are as follows: the first waveguide is connected to the first port, and the second waveguide is connected to the second port; and the polarization splitter-rotator includes a third waveguide and a fourth waveguide, where the fourth waveguide is connected to the first external port, the first waveguide is connected to the third waveguide, and the second waveguide is connected to the fourth waveguide.

The bi-directional light emitting laser is specifically configured to: output, from the first port, first polarized light having a first polarization direction, and output, from the second port, second polarized light having the first polarization direction, where the first polarized light is output to the polarization splitter-rotator by using the first waveguide and the third waveguide, and the second polarized light is output to the polarization splitter-rotator by using the second waveguide and the fourth waveguide. The first polarized light is coupled to the fourth waveguide when passing through the third waveguide, and is converted into third polarized light having a second polarization direction. It should be noted that the first polarization direction is perpendicular to the second polarization direction. The second polarized light and the third polarized light are output from the first external port by using the fourth waveguide.

The polarization splitter-rotator is further configured to receive reflective polarized light whose wavelength is a target wavelength from the first external port. After being reflected back to the polarization splitter-rotator, the reflective polarized light is split into first reflective polarized light having the first polarization direction and second reflective polarized light having the second polarization direction. The first reflective polarized light is injected into the bi-directional light emitting laser by using the fourth waveguide and the second waveguide, and the second reflective polarized light is coupled to the third waveguide when passing through the fourth waveguide, and then, is injected into the bi-directional light emitting laser by using the third waveguide and the first waveguide.

In a possible design, the first polarized light and the second polarized light are TE mode polarized light, the third polarized light is TM mode polarized light, the first reflective polarized light and the third reflective polarized light are TE mode polarized light, and the second reflective polarized light is TM mode polarized light.

A third aspect of the embodiments of the present invention further provides an optical transmitter. The optical transmitter includes the optical reflective multiplexer chip described in the first aspect, M optical fibers, and M laser transmitter chips described in the second aspect, where M is a positive integer and is greater than or equal to 1. In the optical transmitter, a first external port of each laser transmitter chip is connected to a corresponding third external port of the optical reflective multiplexer chip by using a corresponding optical fiber.

In the embodiments of the present invention, the present invention provides the optical reflective multiplexer chip, to resolve the problem that currently a colorless optical transmitter based on a self-injection locking technology has high costs. The laser transmitter chip and the optical reflective multiplexer chip are used in the optical transmitter in the embodiments of the present invention. Compared with an optical transmitter in the prior art, in the optical transmitter in the present invention, no high-cost discrete component (for example, a faraday rotator or an AWG component) is used, and in an actual application, the optical transmitter has relatively low costs.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and persons of ordinary skill in the art may still derive other drawings from these accompanying drawings without creative efforts.

DESCRIPTION OF EMBODIMENTS

The present invention provides an optical reflective multiplexer chip, a laser transmitter chip, and an optical transmitter, to resolve a problem that currently a colorless optical transmitter based on a self-injection locking technology has high costs.

To make persons skilled in the art understand the technical solutions in the present invention better, the following clearly describes the technical solutions in the embodiments of the present invention with reference to the accompanying drawings in the embodiments of the present invention. Apparently, the described embodiments are merely a part rather than all of the embodiments of the present invention. All other embodiments obtained by persons of ordinary skill in the art based on the embodiments of the present invention without creative efforts shall fall within the protection scope of the present invention.

In the specification, claims, and accompanying drawings of the present invention, the terms "first", "second", "third", "fourth", and so on (if existent) are intended to distinguish between similar objects but do not necessarily indicate a specific order or sequence. It should be understood that the data termed in such a way are interchangeable in proper circumstances, so that the embodiments of the present invention described herein can be implemented in other orders than the order illustrated or described herein. Moreover, the terms "include", "contain" and any other variants mean to cover the non-exclusive inclusion, for example, a process, method, system, product, or device that includes a list of steps or units is not necessarily limited to those units, but may include other units not expressly listed or inherent to such a process, method, system, product, or device.

Figure 1:
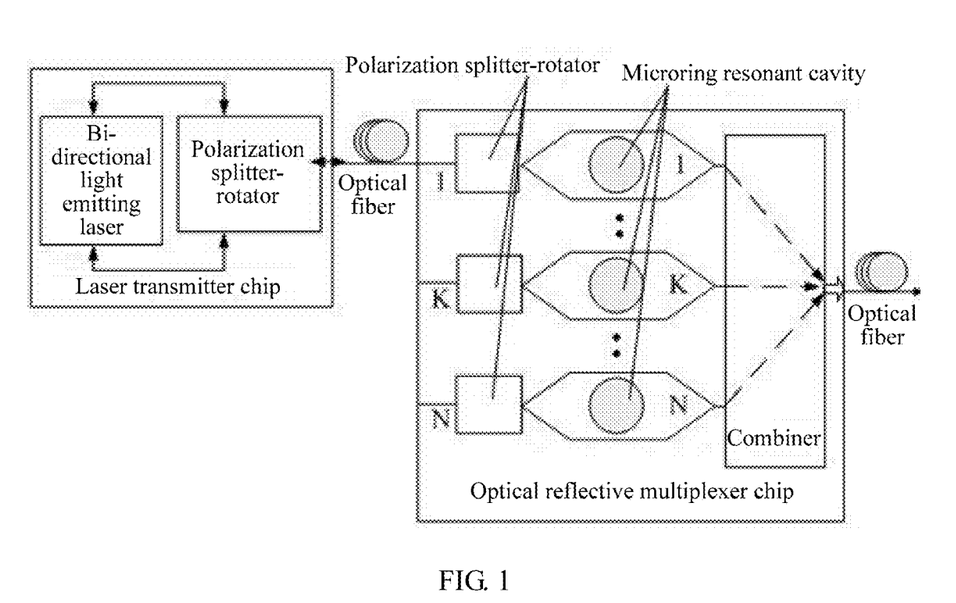
FIG. 1 is a schematic structural diagram of an optical transmitter according to the present invention.

To resolve a coloring problem of an RRU, a concept of a colorless WDM light source is proposed in the industry. However, currently a colorless optical transmitter based on a self-injection locking technology is formed by discrete components having relatively high costs, for example, a Faraday rotator and an AWG, and in an actual application, the optical transmitter has excessively high costs. Therefore, the embodiments of the present invention provide a laser transmitter chip, an optical reflective multiplexer chip, and an optical transmitter, to resolve the foregoing problem of high costs. Specifically, as shown in FIG. 1, FIG. 1 is a schematic structural diagram of an optical transmitter based on self-injection locking according to the present invention. The transmitter includes two integrated chips. One is a laser transmitter chip, including a bi-directional light emitting laser and a polarization splitter-rotator (PSR for short), and main functions include emitting laser light and receiving self-injection light. The other is an optical reflective multiplexer chip, including a plurality of PSRs, a plurality of microring resonant cavities, and a combiner, and main functions include implementing wavelength selection, optical reflection, and rotation of an optical polarization state. A main working principle is as follows: The laser transmitter chip emits light, and inputs the light to the optical reflective multiplexer chip by using an optical fiber, and the optical reflective multiplexer chip selects light of a wavelength and reflects the light to the laser transmitter chip, to implement a self-injection locking process. The bi-directional light emitting laser in the laser transmitter chip may use III-V hybrid integrated microring laser or a vertical cavity grating coupler laser, or may use another bi-directional light emitting laser as long as the laser transmitter chip formed by the bi-directional light emitting laser and the PSRs can implement the functions of emitting laser light and receiving self-injection light. This is not specifically limited herein. Similarly, the PSR may use a waveguide-type asymmetric directional coupler, or may use a planar waveguide grating, or a PSR of another structure as long as the laser transmitter chip formed by the PSR and the bi-directional light emitting laser can complete the foregoing functions. This is not specifically limited herein. In addition, it should be further noted that no limitation is imposed to the microring resonant cavities and the PSR in the optical reflective multiplexer chip as long as the functions of wavelength selection, optical reflection, and rotation of an optical polarization state can be implemented. The optical transmitter implemented by using the laser transmitter chip and the optical reflective multiplexer chip in the embodiments of the present invention can resolve the problem that currently a colorless optical transmitter based on a self-injection locking technology has high costs. For the convenience of understanding and description, the following describes in detail the laser transmitter chip, the optical reflective multiplexer chip, and the optical transmitter in the embodiments of the present invention.

Figure 2:
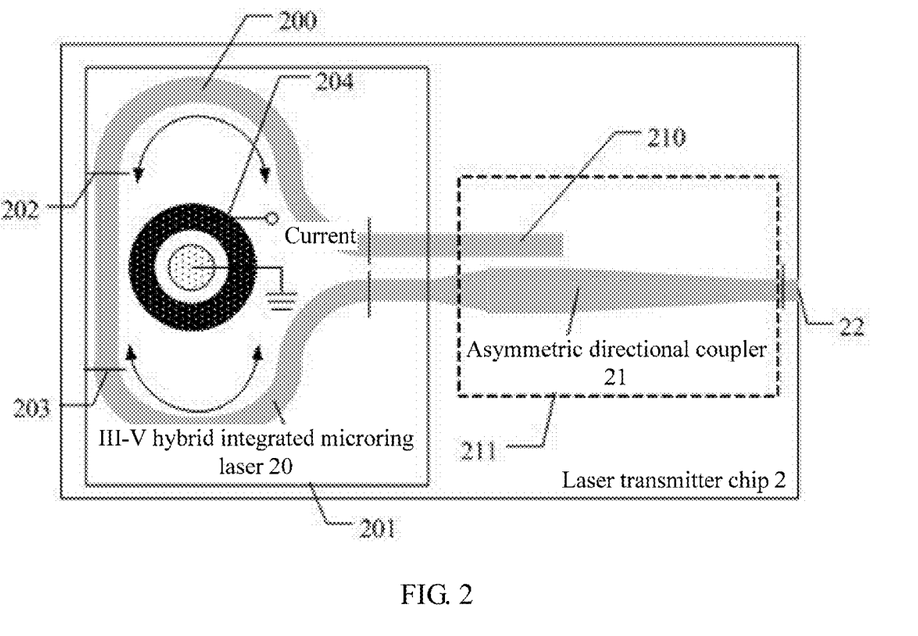
FIG. 2 is a schematic diagram of an embodiment of a laser transmitter chip according to an embodiment of the present invention.

The laser transmitter chip in the embodiments of the present invention is described by using an example in which the bi-directional light emitting laser in the laser transmitter chip uses an III-V hybrid integrated microring laser, and the PSR may use a waveguide-type asymmetric directional coupler. Referring to FIG. 2, FIG. 2 is a schematic structural diagram of a laser transmitter chip 2 according to an embodiment of the present invention. The laser transmitter chip 2 includes an III-V hybrid integrated microring laser 20, an asymmetric directional coupler 21, and an external port 22.

The III-V hybrid integrated microring laser includes a waveguide 200, a waveguide 201, a port 202, a port 203, and a microring resonant cavity 204, and the asymmetric directional coupler 21 includes a waveguide 210 and a waveguide 211. Specific connection relationships between the waveguides and the ports are as follows: The waveguide 200 is connected to the port 202, the waveguide 201 is connected to the port 203, the waveguide 211 is connected to the external port 22, the waveguide 200 is connected to the waveguide 210, and the waveguide 201 is connected to the waveguide 211.

Generation of laser light is briefly described herein. In the III-V hybrid integrated microring laser 20, an external ring of the microring resonant cavity 204 includes a P-doped region and an active region, and an internal ring includes an N-doped region. When an external drive current is imposed, population inversion occurs in the active region in the external ring, and further, laser light is generated. The laser light is constantly enhanced in the microring resonant cavity, and is constantly coupled to a nearby waveguide. That is, the III-V hybrid integrated microring laser 20 is configured to output TE mode polarized light from the port 202 and the port 203. The TE mode polarized light output from the port 202 is output to the asymmetric directional coupler 21 by using the waveguide 200 and the waveguide 210, is coupled to the fourth waveguide 211 when passing through the waveguide 210, and is converted into TM mode polarized light. That is, a polarization state of the TE mode polarized light is rotated by 90 degrees. That is, a polarization direction of the TM mode polarized light is perpendicular to a polarization direction of the TE mode polarized light. The TM mode polarized light is output from the external port 22 by using the waveguide 211. On the other hand, the TE mode polarized light output from the port 203 is transmitted to the asymmetric directional coupler 21 by using the waveguide 201 and the waveguide 211, and is output from the external port 22 by using the waveguide 211.

Similarly, when the TE mode polarized light and the TM mode polarized light are mixed and input to the asymmetric directional coupler 21 from the external port 22, the TE mode polarized light is injected into the III-V hybrid integrated microring laser 20 by using the waveguide 211 and the waveguide 201, and the TM mode polarized light is coupled to the waveguide 210 after passing through the waveguide 211, and is transmitted to the waveguide 200 by using the waveguide 210. It should be noted that the TM mode polarized light transmitted from the waveguide 210 has been converted into TE mode polarized light, that is, a polarization direction is rotated by 90 degrees, and the TE mode polarized light is injected into the III-V hybrid integrated microring laser 20 by using the waveguide 200. That is, light injected into and light output from the III-V hybrid integrated microring laser 20 are both TE mode polarized light.

In addition, it should be noted that, because the III-V hybrid integrated microring laser 20 and the asymmetric directional coupler 21 both belong to the prior art, and the two are integrated into one chip to implement a particular function in this embodiment of the present invention, a structure, a composition material, and the like that are not used in this embodiment of the present invention are not described in this embodiment of the present invention.

Figure 3:
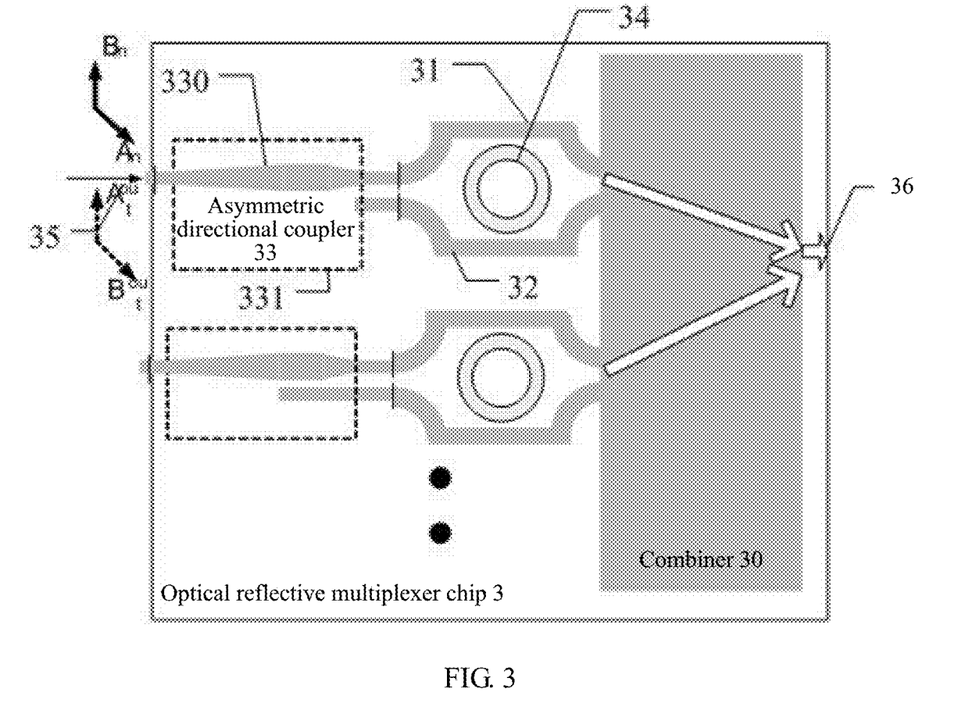
FIG. 3 is a schematic diagram of an embodiment of an optical reflective multiplexer chip according to an embodiment of the present invention.

Likewise, the optical reflective multiplexer chip in the embodiments of the present invention is described by using an example in which the PSR in the optical reflective multiplexer chip uses a waveguide-type asymmetric directional coupler. Referring to FIG. 3, FIG. 3 is a schematic structural diagram of an optical reflective multiplexer chip 3 according to an embodiment of the present invention. The optical reflective multiplexer chip 3 includes a combiner, a second external port, N third external ports, N microring resonant cavities, N asymmetric directional couplers, N first branch waveguides, and N second branch waveguides, where N is a positive integer and is greater than or equal to 1. Because in the optical reflective chip, the functions implemented by the asymmetric directional couplers and the microring resonant cavities are the same, herein, for the convenience of understanding and description, only a function implemented by a channel formed by connecting a waveguide 31, a waveguide 32, an asymmetric directional coupler 33, a microring resonant cavity 34, and an external port 35 is described. Specifically, as shown in FIG. 3, connection relationships are as follows:

The asymmetric directional coupler 33 includes a waveguide 330 and a waveguide 331, the waveguide 330 is connected to the waveguide 31, the waveguide 331 is connected to the waveguide 32, and a combiner 30 is connected to the waveguide 31, the waveguide 32, and an external port 36.

The asymmetric directional coupler 33 is configured to receive light in any polarization state from the port 35 by using the waveguide 330. The light in any polarization state is split into two components, namely, TE mode polarized light $A_{in}$ and TM mode polarized light $B_{in}$, after passing through the asymmetric directional coupler 33. It should be noted that a polarization direction of the TE mode polarized light $A_{in}$ is perpendicular to a polarization direction of the TM mode polarized light $B_{in}$, that is, a degree difference is 90 degrees. The TE mode polarized light $A_{in}$ is transmitted to the waveguide 31 by using the waveguide 30. Subsequently, when light whose wavelength is λ in the TE mode polarized light is aligned with a resonant peak of the microring resonant cavity 34, the light whose wavelength is λ is coupled to the microring resonant cavity 34. After the light enters the microring resonant cavity 32, a part of the light is reflected back to the asymmetric directional coupler 33 by using the waveguide 32 and the waveguide 331. After entering the asymmetric directional coupler 33, the part of the light is coupled to the waveguide 330 by using the waveguide 331, and is converted into TM mode polarized light $A_{out}$, and is output from the external port 35. The other part of the light enters the combiner 30 by using one input port of the combiner 30. It should be noted that a function of the combiner is implementing multi-channel aggregation: aggregating light entering the combiner 30 from N channels, and outputting the aggregated light from the external port 36.

Similarly, the TM mode polarized light $B_{in}$ is coupled to the waveguide 331 from the waveguide 330, is converted into TE mode polarized light, and is transmitted to the waveguide 32 by using the waveguide. The wavelength λ is selected by using the microring resonant cavity 34. A specific process is similar to the process described above. That is, after the wavelength λ is selected, a part of the light is reflected from the external port 35 as TE mode polarized light $B_{out}$ by using the waveguide 31 and the waveguide 330, and the other part of the light enters the combiner 30.

By using the process described above, the optical reflective transmitter chip implements three functions: selecting a mode of input light, reflection, and rotating a polarization state by 90 degrees.

Figure 4:
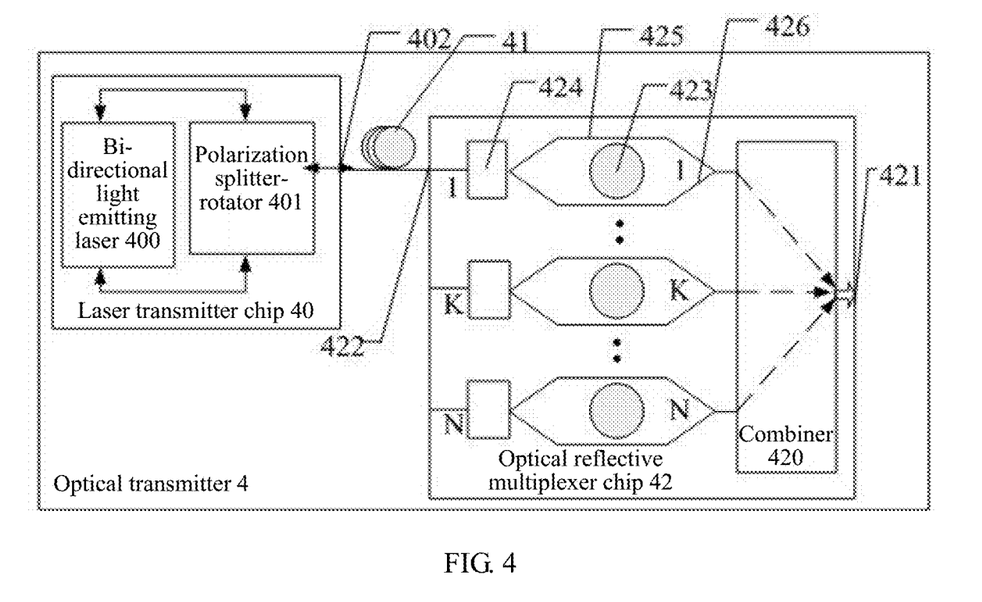
FIG. 4 is a schematic diagram of an embodiment of an optical transmitter according to an embodiment of the present invention.

The foregoing describes the structures and the functions of the laser transmitter chip and the optical reflective multiplexer chip. The following describes an optical transmitter formed by the laser transmitter chip, the optical reflective multiplexer chip, and an optical fiber, and a function implemented by the optical transmitter. Referring to FIG. 4, FIG. 4 shows an optical transmitter according to an embodiment of the present invention. It should be noted that the optical transmitter includes one or more laser transmitter chips. Herein, for the convenience of description, a description is given by using a case in which there is one laser transmitter chip. Referring to FIG. 4, FIG. 4 is a schematic diagram of the optical transmitter in this embodiment of the present invention. The optical transmitter includes a laser transmitter chip 40, an optical fiber 41, and an optical reflective multiplexer chip 42. The laser transmitter chip 40 includes a bi-directional light emitting laser 400, a polarization splitter-rotator 401, and an external port 402. The optical reflective multiplexer chip 42 includes a combiner 420, an external port 421, N second external ports 422, N microring resonant cavities 423, N polarization splitter-rotators 424, N waveguides 425, and N waveguides 426, where N is a positive integer and is greater than or equal to 1, and N is greater than or equal to M. The combiner 420 is connected to the waveguide 425, the waveguide 426, and the external port 421, and the external port 402 is connected to the external port 422 by using the optical fiber 41.

The bi-directional light emitting laser 400 is configured to output polarized light. The polarized light is output to the polarization splitter-rotator 401. After passing through the polarization splitter-rotator 401, the polarized light is output to a corresponding polarization splitter-rotator 424 from the external port 402. After passing though the corresponding polarization splitter-rotator 424, the polarized light is transmitted to the waveguide 425 and the waveguide 426. A corresponding microring resonant cavity 423 locks target polarized light whose wavelength is a target wavelength in the polarized light, outputs a part of the target polarized light from the external port 420 by using the combiner 420, and reflects the other part of the target polarized light back to the polarization splitter-rotator 424 as reflected light, and the reflected light is reflected back to the polarization splitter-rotator 401 from the corresponding external port 422. After passing through the polarization splitter-rotator 401, the reflected light is injected into the bi-directional light emitting laser 400, to implement self-injection locking of the bi-directional light emitting laser 400.

The optical transmitter in this embodiment of the present invention is implemented by using the laser transmitter chip and the optical reflective multiplexer chip. The optical transmitter transmits multi-wavelength polarized light by using the laser transmitter chip. After the polarized light is transmitted by using the optical fiber, the optical reflective multiplexer chip implements wavelength selection on the polarized light and reflects the polarized light back to the laser transmitter chip. Finally, the optical transmitter locks a particular wavelength, and keeps working in the wavelength. Compared with an optical transmitter in the prior art, in the optical transmitter in the present invention, no high-cost discrete component is used, for example, a faraday rotator, or an AWG component, and in an actual application, the optical transmitter has relatively low costs.

Figure 5:
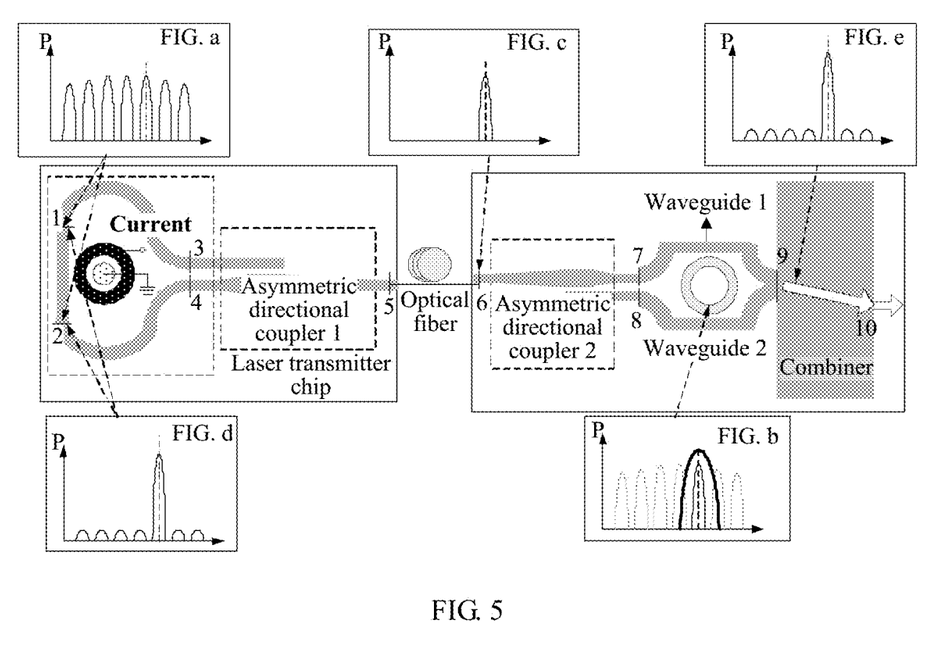
FIG. 5 is a schematic diagram of a self-injection locking process of an optical transmitter according to an embodiment of the present invention.

For the convenience of understanding, the following describes a self-injection process based on an optical transmitter formed by the laser transmitter chip in FIG. 2 and the optical reflective multiplexer chip in FIG. 3, as shown in FIG. 5:

In FIG. 5, FIG. a is a spectrogram of light output from port 1 and port 2 of an III-V hybrid integrated microring laser when no reflected light is injected into the laser. In this case, longitudinal mode partitions of light in the III-V hybrid integrated microring laser do not greatly differ from each other, and a side mode suppression ratio is very poor. Because the III-V hybrid integrated microring laser is a bi-directional light emitting laser, a port 1 and a port 2 are symmetric. For the convenience of description and understanding, first, the port 1 is used for analysis. In the laser transmitter chip, TE mode polarized light output from port 1 is input to an asymmetric directional coupler 1 from a port 3, and is converted into TM mode polarized light on a port 5 and output from the port 5. After being transmitted by using an optical fiber, the original TM mode polarized light has been converted into light in any polarization mode, and is input to the optical reflective multiplexer chip. Therefore, on a port 6, the input light is split into two components, namely, TE mode polarized light and TM mode polarized light. After passing through an asymmetric directional coupler 2, the TE mode polarized light is input to a waveguide 1 from a port 7, and the TM mode polarized light is converted into the TE mode polarized light and is input to a waveguide 2 from a port 8. When a wavelength λ1 of light transmitted in the two waveguides is aligned with a resonant peak of a microring resonant cavity, the longitudinal mode is selected and the light enters the microring resonant cavity, as shown in FIG. b. A specific process is as follows: Light coupled and entering the microring resonant cavity from the waveguide 1 is coupled and output by using the waveguide 2, and light coupled and entering the microring resonant cavity from the waveguide 2 is coupled and output by using the waveguide 1. In this way, light entering the microring resonant cavity from the port 7 returns back from a port 8, and light entering the microring resonant cavity from the port 8 returns back from the port 7. After passing through a PSR, a polarization state of reflected light on the port 6 is obtained by rotating a polarization state of original input light by 90 degrees, and wavelength selection is implemented by using the microring resonant cavity. An output spectrum is shown in FIG. c. The reflected light returns back to the laser transmitter chip after passing through a single-mode optical fiber. Persons skilled in the art may know that a polarization state of the reflected light in the optical fiber constantly rotates and changes, but a degree difference between a polarization state of any light at any point on the optical fiber and a polarization state of the light output by the laser always is 90 degrees. Therefore, when the reflected light arrives at the port 5 of the laser transmitter chip, a polarization state of the reflected light is perpendicular to the TM mode polarization state of the originally output light, and is a TE mode polarization state. The reflected light in the TE polarization state is output from a port 4 after passing through the PSR, and is injected into the bi-directional light emitting laser. It should be noted that the foregoing process is merely a dynamic process of implementing self-injection locking, and actually, a plurality of times of repetitions are needed, so that a longitudinal mode whose wavelength is λ is constantly enhanced, and other modes are constantly suppressed, to form a very high side mode suppression ratio. Finally, a wavelength of the III-V hybrid integrated microring laser is locked to the wavelength λ obtained by using filtration by the microring resonant cavity, as shown in FIG. d. It may be understood that a case in which the III-V hybrid integrated microring laser emits light from the port 2 is similar to a case in which the III-V hybrid integrated microring laser emits light from the port 5, and a difference lies in that the light output from the port 5 is TE mode polarized light and corresponding reflected light is TM mode polarized light. During actual operation, light is emitted from the port 1 and the port 2 and reflected light is injected into the port 1 and the port 2 at the same time, to implement self-injection locking. As shown in FIG. e, after self-injection locking enters a stable state, the output light is output to the combiner, and is output from a port 10 after being combined with light from another channel.

Persons of ordinary skill in the art may understand that all or some of the processes of the methods in the embodiments may be implemented by a computer program instructing relevant hardware. The program may be stored in a computer readable storage medium. When the program runs, the processes of the methods in the embodiments are performed. The storage medium may include: a magnetic disk, an optical disc, a read-only memory (ROM for short), or a random access memory (RAM for short).

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:
1. A laser transmitter chip, comprising:
a bi-directional light emitting laser, a polarization splitter-rotator, and a first external port, wherein:

the bi-directional light emitting laser is connected to the polarization splitter-rotator, and the polarization splitter-rotator is connected to the first external port;
the bi-directional light emitting laser is configured to emit polarized light; and
the polarization splitter-rotator is configured to:
perform polarized coupling on the polarized light emitted by the bi-directional light emitting laser;
output the coupled light from the first external port;
receive reflective polarized light corresponding to the polarized light from the first external port;
perform polarized splitting on the reflective polarized light to generate split light; and
separately inject the split light into the bi-directional light emitting laser, wherein a polarization direction of the polarized light emitted by the bi-directional light emitting laser is the same as a polarization direction of the light injected into the bi-directional light emitting laser,
wherein the bi-directional light emitting laser comprises a first waveguide, a second waveguide, a first port, and a second port, wherein the first waveguide is connected to the first port, and wherein the second waveguide is connected to the second port;
wherein the polarization splitter-rotator comprises a third waveguide and a fourth waveguide, wherein the fourth waveguide is connected to the first external port;
wherein the first waveguide is connected to the third waveguide, and wherein the second waveguide is connected to the fourth waveguide;
wherein the bi-directional light emitting laser is configured to:
emit, from the first port, first polarized light having a first polarization direction; and
emit, from the second port, second polarized light having the first polarization direction;
wherein the first polarized light is output to the polarization splitter-rotator by using the first waveguide and the third waveguide;
wherein the second polarized light is output to the polarization splitter-rotator by using the second waveguide and the fourth waveguide;
wherein the first polarized light is coupled to the fourth waveguide when passing through the third waveguide, and is converted into third polarized light having a second polarization direction, wherein the first polarization direction is perpendicular to the second polarization direction;
wherein the second polarized light and the third polarized light are output from the first external port by using the fourth waveguide;
wherein the polarization splitter-rotator is configured to receive the reflective polarized light from the first external port;
wherein after passing through the polarization splitter-rotator, the reflective polarized light is split into first reflective polarized light having the first polarization direction and second reflective polarized light having the second polarization direction;
wherein the first reflective polarized light is injected into the bi-directional light emitting laser using the fourth waveguide and the second waveguide; and
wherein the second reflective polarized light is coupled to the third waveguide after passing through the fourth waveguide, and wherein the second reflective polarized light is converted into third reflective polarized light having the first polarization direction when transmitted to the first waveguide by using the third waveguide, and is injected into the bi-directional light emitting laser by using the first waveguide.

2. The laser transmitter chip according to claim 1, wherein:
the first polarized light and the second polarized light are TE mode polarized light, and the third polarized light is TM mode polarized light; and
the first reflective polarized light and the third reflective polarized light are TE mode polarized light, and the second reflective polarized light is TM mode polarized light.

3. The laser transmitter chip according to claim 1, wherein the bi-directional light emitting laser is an III-V hybrid integrated microring laser or a vertical cavity grating coupler laser.

4. A laser transmitter chip, comprising:
a bi-directional light emitting laser, a polarization splitter-rotator, and a first external port, wherein:
the bi-directional light emitting laser is connected to the polarization splitter-rotator, and the polarization splitter-rotator is connected to the first external port;
the bi-directional light emitting laser comprises a first waveguide, a second waveguide, a first port, and a second port, wherein the first waveguide is connected to the first port, and wherein the second waveguide is connected to the second port;
the polarization splitter-rotator comprises a third waveguide and a fourth waveguide, wherein the fourth waveguide is connected to the first external port, wherein the first waveguide is connected to the third waveguide, and wherein the second waveguide is connected to the fourth waveguide;
emit, from the first port, first polarized light having a first polarization direction; and
emit, from the second port, second polarized light having the first polarization direction;
wherein the first polarized light is output to the polarization splitter-rotator by using the first waveguide and the third waveguide, and wherein the second polarized light is output to the polarization splitter-rotator by using the second waveguide and the fourth waveguide; and
the polarization splitter-rotator is configured to:
perform polarized coupling on the first polarized light and the second polarized light emitted by the bi-directional light emitting laser, wherein the first polarized light is coupled to the fourth waveguide when passing through the third waveguide, and is converted into third polarized light having a second polarization direction, wherein the first polarization direction is perpendicular to the second polarization direction; and
output the second polarized light and the third polarized light from the first external port by using the fourth waveguide;
the polarization splitter-rotator is further configured to:
receive reflective polarized light from the first external port;
perform polarized splitting on the reflective polarized light to generate a first reflective polarized light having the first polarization direction and a second reflective polarized light having the second polarization direction, wherein the second reflective polarized light is coupled to the third waveguide after passing through the fourth waveguide, and wherein the second reflective polarized light is converted into third reflective polarized light having the first polarization direction when transmitted to the first waveguide by using the third waveguide; and separately inject the first reflective polarized light and the third reflective polarized light into the bi-directional light emitting laser, wherein the first reflective polarized light is injected into the bi-directional light emitting laser using the fourth waveguide and the second waveguide, and wherein the third reflective polarized light is injected into the bi-directional light emitting laser by using the first waveguide.

5. The laser transmitter chip according to claim 4, wherein:

the first polarized light and the second polarized light are TE mode polarized light, and the third polarized light is TM mode polarized light; and the first reflective polarized light and the third reflective polarized light are TE mode polarized light, and the second reflective polarized light is TM mode polarized light.

6. The laser transmitter chip according to claim 4, wherein the bi-directional light emitting laser is an III-V hybrid integrated microring laser or a vertical cavity grating coupler laser.

* * * * *

UNITED STATES PATENT AND TRADEMARK OFFICE
CERTIFICATE OF CORRECTION

PATENT NO. : 10,841,012 B2  
APPLICATION NO. : 16/051889  
DATED : November 17, 2020  
INVENTOR(S) : Tao Wang and Ning Liu

Page 1 of 1

It is certified that error appears in the above-identified patent and that said Letters Patent is hereby corrected as shown below:

In the Claims

In Column 12, Line 33, in Claim 4, below "to the fourth waveguide;" insert -- the bi-directional light emitting laser is configured to: --.

Signed and Sealed this  
Sixth Day of April, 2021

Drew Hirshfeld  
*Performing the Functions and Duties of the*  
*Under Secretary of Commerce for Intellectual Property and*  
*Director of the United States Patent and Trademark Office*